United States Patent [19]

Sahara et al.

[11] Patent Number: 4,951,253
[45] Date of Patent: Aug. 21, 1990

[54] SEMICONDUCTOR MEMORY SYSTEM

[75] Inventors: Hiroshi Sahara, Tokyo; Haruki Toda, Yokohama; Shigeo Oshima, Tokyo, all of Japan

[73] Assignee: Kabushiki Kaisha Toshiba, Kawasaki, Japan

[21] Appl. No.: 264,741

[22] Filed: Oct. 31, 1988

[30] Foreign Application Priority Data

Nov. 2, 1987 [JP] Japan ................................. 62-278045

[51] Int. Cl.⁵ ............................................... G11C 7/00
[52] U.S. Cl. .................................... 365/200; 365/221; 365/240
[58] Field of Search ........... 365/200, 239, 240, 230.09, 365/221; 371/11

[56] References Cited

U.S. PATENT DOCUMENTS 4,473,895 9/1984 Tatematsu ........................... 365/200

OTHER PUBLICATIONS

S. Ishimoto et al., "A 256K Dual Port Memory," Feb. 13, 1985, 1985 IEEE International Solid-State Circuits Conference, Digest of Technical Papers, pp. 38–39.

Primary Examiner—Joseph A. Popek
Attorney, Agent, or Firm—Finnegan, Henderson, Farabow, Garrett and Dunner

[57] ABSTRACT

In a semiconductor memory system of the serial column access type, a redundant column is used for replacing a defective column. Redundant data lines are connected to the redundant column through a redundant column selection gate. A defective address detection circuit detects the address of a defective column to enable the redundant column selection gate. An address counter is provided for a defective address detection circuit. A redundant column selection circuit selects the redundant column in response to a detection signal from the defective address detection circuit. A data line switching circuit switches, in redundant column select mode, the data lines connecting to a data input/output drive circuit from said regular data lines to the redundant data lines. With this circuit arrangement, in a redundant column select mode, the regular data lines are separated from the data input/output drive circuit. Therefore, even if a shift register constituting a regular column selection circuit operates and the defective column selection gate is enabled to set up a connection of the defective column to the regular data lines, the error data from the defective column is never output. Further, the shift register is operable irrespective of the defecting column detection.

17 Claims, 8 Drawing Sheets

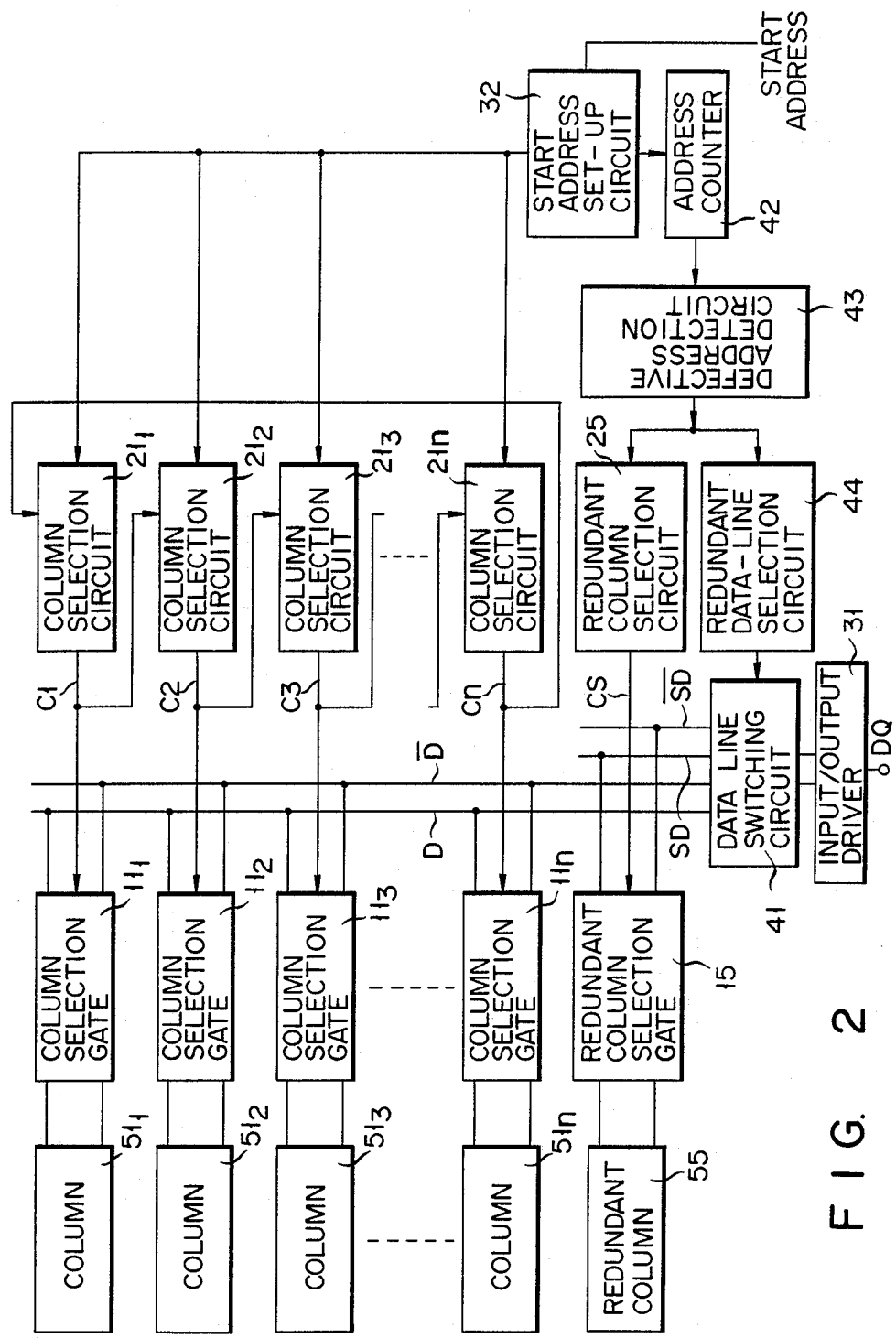
F I G. 2

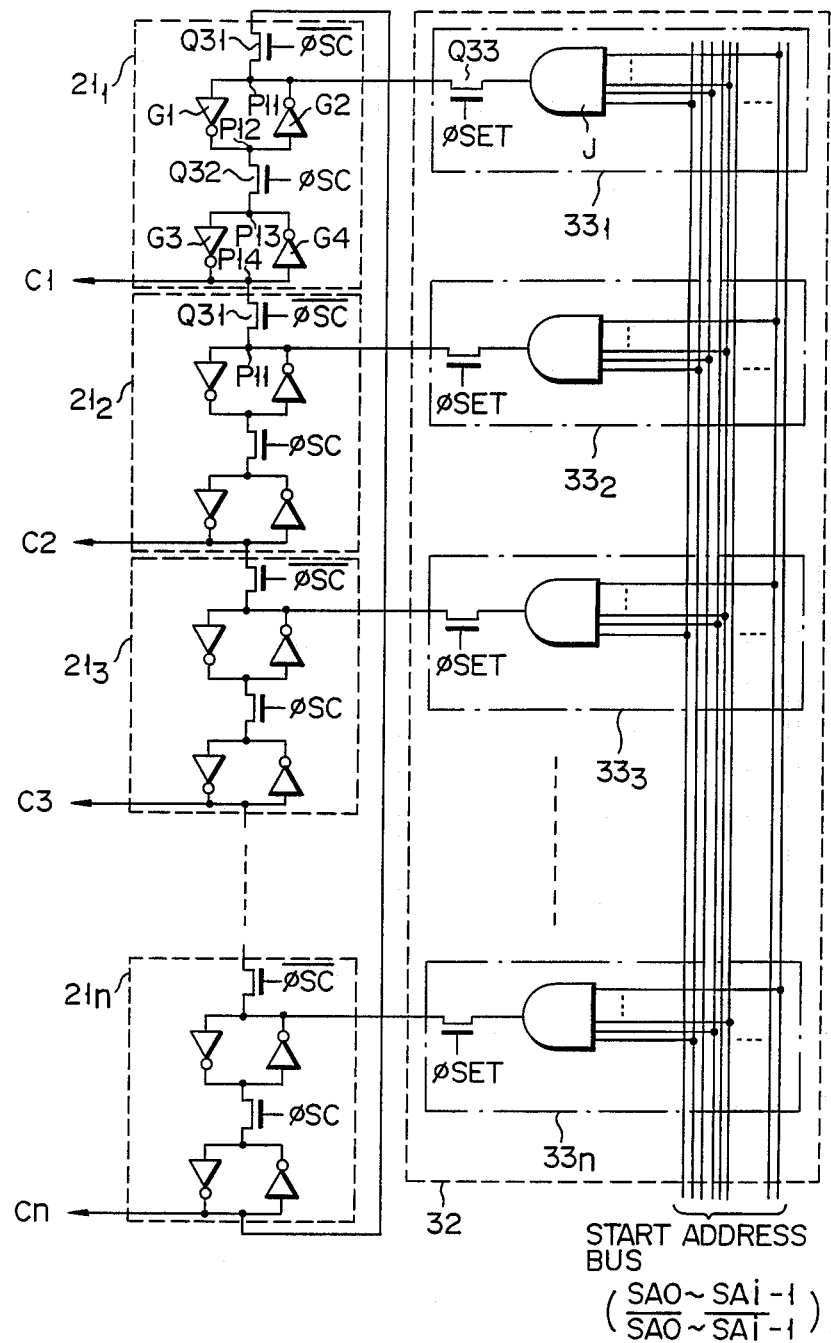
F I G. 6

SEMICONDUCTOR MEMORY SYSTEM

BACKGROUND OF THE INVENTION

1. Field of the Invention

This invention relates to a semiconductor memory system and, more particularly, to a semiconductor memory system of the serial column access type.

2. Description of the Related Art

There has been known a semiconductor memory system of the type in which the columns are serially accessed. An example of this type of memory system uses a shift register for the column selection circuits. This will be described referring to FIG. 1. In the figure, reference numerals $51_1$ to $51n$ designate columns (consisting of bit line pairs or data registers), and characters D and $\overline{D}$ paired data lines. Column selection gates $61_1$ to $61n$ are for connecting columns $51_1$ to $51n$ with the data lines. Column selection circuits $71_1$ to $71n$ are constructed with a shift register. Output signals C1 to Cn are used for two types of signals, column selection signals for enabling column selection gates $61_1$ to $61n$, and set-up signals for driving the succeeding stages $71_1$ to $71n$ in the shift register in the next access cycle. Input-/output drive circuit 81 is for executing the write and read operation of data between paired data lines D and $\overline{D}$ and input/output pin DQ. Start address set-up circuit 82 is for setting up shift registers $71_1$ to $71n$ in accordance with a start address.

After column select circuit $71_1$, for example, is first set up by start address set-up circuit 82, these circuits $71_1$ to $71n$ are successively driven in synchronism with clock pulses for memory system control which are externally and serially applied. In response to a clock pulse, column selection circuit $71_1$ is driven, to produce signal C1. The produced signal enables column selection gate $61_1$ to set up the connection between column $51_1$ and paired data lines D and $\overline{D}$. The produced signal C1 further sets up the next stage column selection circuit $71_2$ for the next access cycle. In response to the next clock pulse, the next stage column selection circuit $71_2$ is driven to produce signal C2. The produced signal C2 enables column selection gate $61_2$ to set up the connection between column $51_2$ and paired data lines D and $\overline{D}$. The produced signal C2 further sets up the next stage column selection circuit $71_3$ for the next access cycle. In this way, column selection circuits $71_1$ to $71n$ are enabled in successive order in synchronism with successive clock signals, and consequently columns $51_1$ to $51n$ are serially accessed.

To cope with problems resulting from a defective column, a redundant column may be used. In the memory system arranged as shown in FIG. 1, however, it is impossible to use the redundant column. The reason for this follows. For example, if column $51_2$ is defective, and replaced with a redundant column, defective column $51_2$ must be invalidated by disabling column selection gate $61_2$. To disable this gate, the shift register including the column selection circuits $71_2$ must be stopped in operation. If this shift register operation is stopped, the next stage shift register $71_3$ cannot be driven. This indicates that the above serial access of this memory system is impossible.

SUMMARY OF THE INVENTION

Accordingly, an object of this invention is to provide a semiconductor memory system of the serial column access type, which allows the redundant column to be used.

According to the present invention, these is provided a semiconductor memory system of the serial column access type comprising "n" regular columns, where "n" is a positive integer, "n" column selection gates provided respectively corresponding to said regular columns, regular data lines connected through said column selection gates respectively to said columns, "n" column selection circuits respectively provided for said column selection gates, a redundant column used for replacing a defective column, a redundant column selection gate provided for said redundant column, redundant data lines connected to said redundant column through said redundant column selection gate, a data input/output driver, a defective address detection means for detecting the address of a defective column to select said redundant column, and a data line switching circuit for switching, in redundant column select mode, the data lines connecting to a data input/output drive circuit from said regular data lines to said redundant data lines.

According to the present invention, these is further provided a semiconductor memory system of the serial column access type comprising "n" regular columns, where "n" is a positive integer, "n" column selection gates respectively provided corresponding to said regular columns, regular data lines connected through said column selection gates respectively to said columns, "n" column selection circuits comprising a shift register, respectively provided for said column selection gates, a redundant column used for replacing a defective column, redundant data lines connected to said redundant column through a redundant column selection gate, a defective address detection circuit for detecting the address of a defective column to enable said redundant column selection gate, an address counter for said defective address detection circuit, a start address set-up circuit for setting up said column selection circuits and said address counter, a redundant column selection circuit for selecting said redundant column in response to a detection signal from said defective address detection circuit, and a data line switching means for switching, in redundant column select mode, the data lines connecting to a data input/output drive circuit from said regular data lines to said redundant data lines.

In the memory system thus arranged, the redundant data line pair is provided separately from the regular data line pair, while being connected through the reduntant column selection gate to the redundant column. This feature allows the redundant column to be installed in the memory system.

Further, the memory system according to this invention is provided with the address counter for monitoring the address data, a defective address detection circuit for detecting a defective address from the output signal of the address counter, the redundant column selection circuit for selecting a redundant column at the time of a defective address, and the redundant data selection circuit for switching the data line connecting to the data input/output drive circuit from the regular data lines to the redundant data lines in a redundant column select mode. With this circuit arrangement, in a redundant column selection mode, the regular data lines are separated from the data input/output drive circuit. Therefore, even if the shift register operates and the defective column selection gate is enabled to set up a connection of the defective column to the regular data lines, the error data from the defective column is never output. Further, the shift register is operable irrespective of the defective column detection.

BRIEF DESCRIPTION OF THE DRAWINGS

FIG. 2 shows a block diagram of a memory system of the serial column access type which is an embodiment of this invention;

FIG. 6 shows a circuit diagram showing the column selection circuit and the start address set-up circuit in the memory system of FIG. 2;

DETAILED DESCRIPTION OF THE PREFERRED EMBODIMENTS

Figure 1:
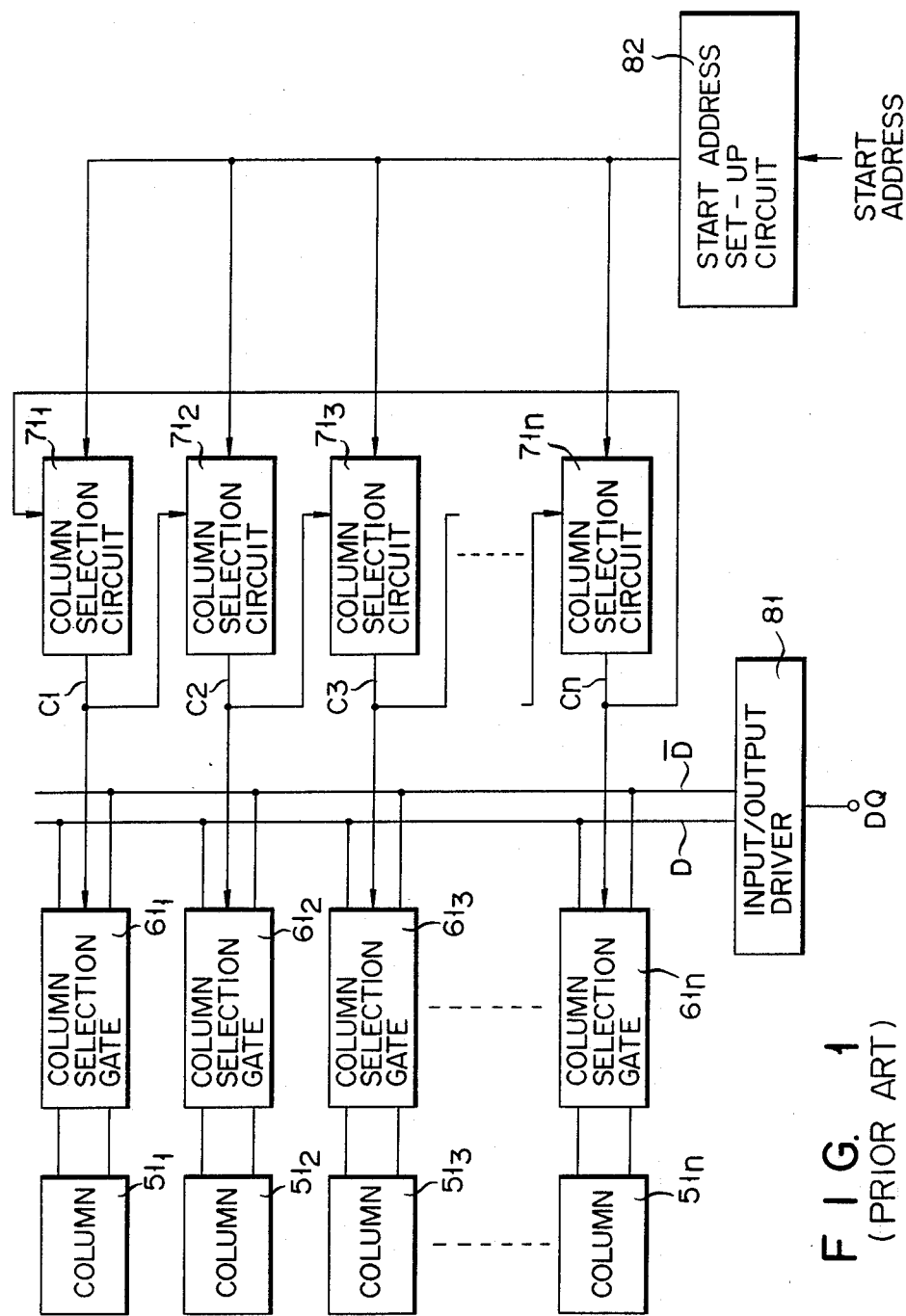
FIG. 1 shows a block diagram of a prior memory system of the serial column access type.

A semiconductor memory system of the serial column access type according to this invention will be described with reference to the accompanying drawings.

In FIG. 2 showing the memory system as a first embodiment of this invention, reference numerals $51_1$ to $51n$ designate columns (consisting of bit line pairs or data registers), and characters D and $\overline{D}$ paired regular data lines. Column selection gates $11_1$ to $11n$ connect columns $51_1$ to $51n$ with the regular data lines D and $\overline{D}$. Column selection circuits $21_1$ to $21n$ are made up of a shift register. Output signals C1 to Cn are used for two types of signals, column selection signals for enabling column selection gates $11_1$ to $11n$, and set-up signals for operating the succeeding shift registers $21_1$ to $21n$ in the next access cycle. A redundant column selection gate 15 is for connecting redundant column 55 and redundant data lines SD and $\overline{SD}$. Redundant column selection circuit 25 produces a redundant column selection signal for enabling redundant column selection gate 15. A data input/output pin is designated by DQ, and an input/output drive circuit by 31. A data line switching circuit is provided. In a normal mode, this switching circuit 41 connects paired regular data lines D and $\overline{D}$ to input/output drive circuit 31. In a redundant column select mode, the switching circuit 41 separates the regular data lines D and $\overline{D}$ from the drive circuit 31, and connects redundant data line pair SD and $\overline{SD}$ to input/output drive circuit 31. Address counter 42 is provided for defective address detection circuit 43. Start address set-up circuit 32 sets up column select circuits $21_1$ to $21n$, in response to a start address. The redundant data-line selection circuit is designated by 44.

In the memory system thus arranged, if column $51_3$ is defective, then the correct data originally contained in column $51_3$ is programmed in redundant column 55. When an address of the defective column, i.e., a defective address, is detected, data line switching circuit 41 operates to replace defective column $51_3$ with redundant column 55.

Figure 3:
FIG. 3 shows a waveform of a clock pulse used in the memory system of FIG. 2.

In operation, start address set-up circuit 32 sets up one of column selection circuits $21_1$ to $21n$, which corresponds to a start address, to enable the column selection circuit. Start address set-up circuit 32 also sets up address counter 42. With the toggle function of clock pulses (FIG. 3) for controlling an overall operation of the memory system under discussion, column selection circuits $21_1$ to $21n$ successively shift the data contained therein. In synchronism with the clock pulses, address counter 42 successively counts up its contents, always monitoring the input address. When an output of address counter 42 is a defective address, defective address detection circuit 43 detects this, and produces a signal for transmission to redundant column selection circuit 25 and redundant data-line selection circuit 44. The output signal of redundant column selection circuit 25 enables redundant column selection circuit gate 15 to set up the connection between redundant column 55 and redundant data line pair SD and $\overline{SD}$. The output signal of redundant data-line selection circuit 44 drives data line switching circuit 41. The driven switching circuit 41 separates regular data line pair D and $\overline{D}$ from input/output drive circuit 31, while setting up the connection between redundant data line pair SD and $\overline{SD}$ and input/output drive circuit 31. Finally, a path routed from redundant column 55 to input/output pin DQ is formed. Under this condition, the data flow is ensured between redundant column 55 and input/output pin DQ, while column selection circuits $21_1$ to $21n$ (including the column selection circuit $21_3$ associated with the defective column $51_3$) continue the normal operation independent of the detection of the defective address. In this way, the memory system allows a smooth column directional access even if a defective column is contained in the columns.

In the further description of the operation of the memory system, let us assume that with the start address set up by start address set-up circuit 32, column selection circuit $21_1$ is first activated. Shift register $21_1$ operates in synchronism with clock pulses CP, to produce output signal C1. The output signal C1 enables column selection gate $11_1$ to set up the connection between column $51_1$ and regular data line pair D and $\overline{D}$. Under this condition, data-line switching circuit 41 connects data line pair D and $\overline{D}$ and data input/output driver 31 followed by data input/output pin DQ. Therefore, a signal route ranging from column $51_1$ to data input/output pin DQ is set up. The output signal C1 is applied to the next stage of column selection circuit $21_2$ for the next access cycle. At arrival of the next clock pulse, shift register $21_2$ is activated to produce output signal C2. The output signal C2 enables column selection gate $11_2$, to set up a signal route from column $51_2$ to data input/output pin DQ. Further, output signal C2 goes to and sets up the succeeding stage of column selection circuit $21_3$ for the next access cycle. In this way, column selection circuits $21_1$ to $21n$ are successively activated and therefore the serial selection of columns $51_1$ to $51n$ progresses. During the operation of shift registers $21_1$ to $21n$, address counter 42 counts up its contents. In other words, address counter 42 constantly monitors the address.

When address counter 42 counts the address, or defective address, of defective column $51_3$, defective address detection circuit 43 detects this defective address. The output signal of detector 43 drives circuits 44 and 41 to separate regular data line pair D and $\overline{D}$ from data input/output pin DQ, as already described. If this circuit separation does not occur, the error data from defective column $51_3$ travels through regular data lines D and $\overline{D}$ to reach input/output pin DQ, resulting in reading out of error data. The error data read out operation from defective column $51_3$ is of course performed in cooperation with its associated circuits, column selection circuit $21_3$ and column selection gate $11_3$ in the manner described above.

In the memory system according to this invention, however, when defective address data is detected, the regular data lines D and $\overline{D}$ are disconnected from input-/output driver 31 to block the read out error data from going to input/output pin DQ. At the same time, redundant column selection circuit 25 is driven by circuit 43 to produce a signal CS. The output signal CS enables redundant column selection gate 15 to set up a signal path ranging from redundant column 55 to input/output pin DQ. In this way, the correct data preset in redundant column 55 substitutes for the error data of column $51_3$. It is noted that during the read out operation of the programmed correct data from redundant column 55, column selection circuit $21_3$ is smoothly being operated in a normal way.

Figure 4:
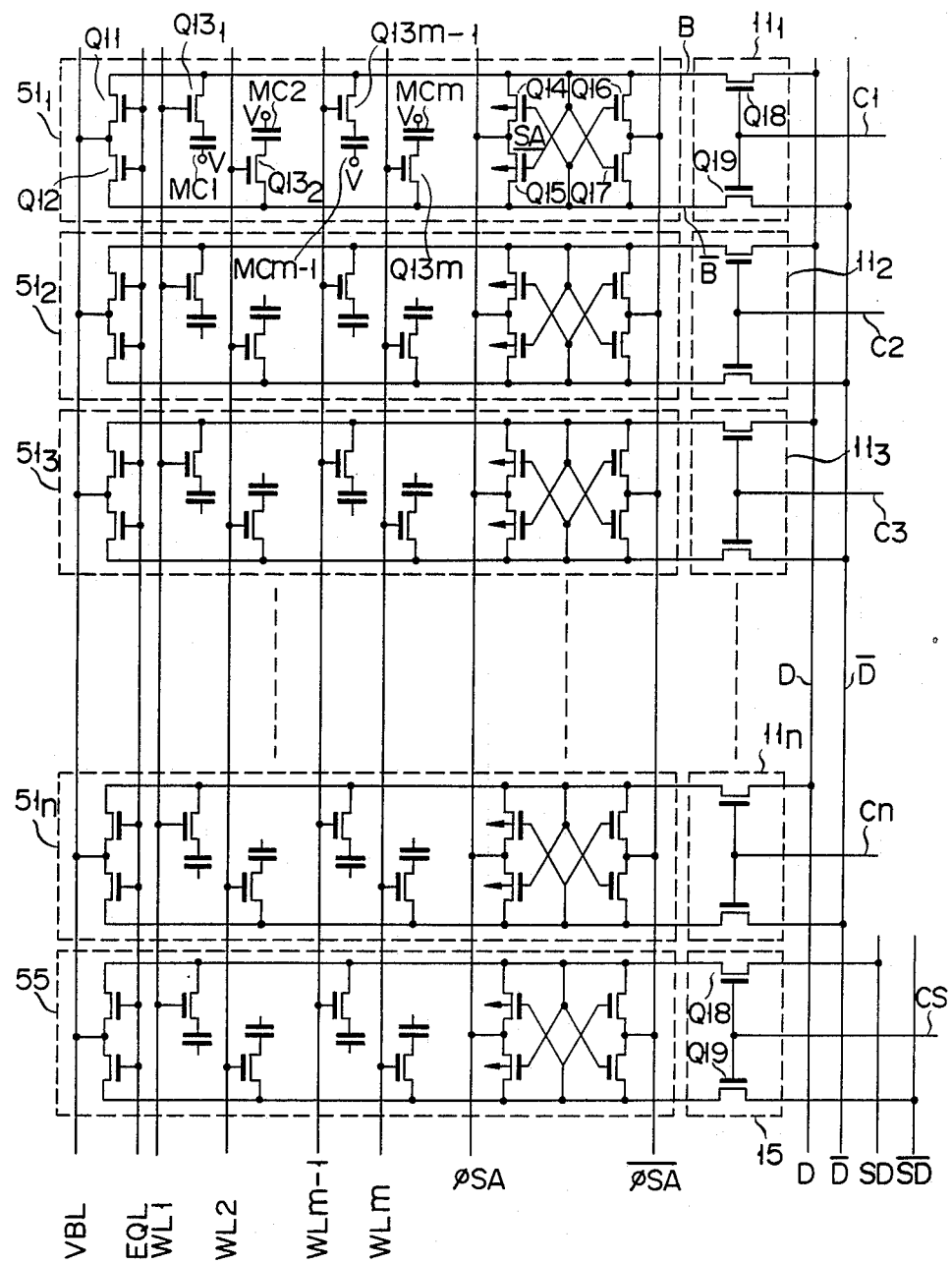
FIG. 4 shows a circuit diagram showing the columns and the column selection gates in the memory system of FIG. 2.

FIG. 4 shows a circuit diagram of columns $51_1$ to $51n$, redundant column 55, and column selection gates $11_1$ to $11n$, and redundant column selection gate 15. Those columns and column selection gates have substantially the same circuit arrangements. Hence, column $51_1$ and column selection gate $11_1$ will typically be described.

As shown, column $51_1$ is made up of a pair of bit lines B and $\overline{B}$, an equalizing circuit including two N channel MOS transistors Q11 and Q12, transfer transistors $Q13_1$ to $Q13m$ coupled at the gates with word lines WL1 to WLm, memory cells MC1 to MCm coupled with transfer transistors $Q13_1$ to $Q13m$, and a sense amplifier constructed with P channel MOS transistors Q14 and Q15 and N channel MOS transistors Q16 and Q17 for amplifying and sensing data read out on paired bit lines B and $\overline{B}$. Equalizing transistors Q11 and Q12 are inserted in series between bit lines B and $\overline{B}$, and their node is connected to precharge signal VBL. Equalizing signal EQL is applied to the gates of transistors Q11 and Q12. The gates of transfer transistors $Q13_1$ to $Q13m$ are connected to word lines WL1 to WLm, respectively. Those transfer transistors $Q13_1$ to $Q13m$ are connected to bit lines B and $\overline{B}$ and cell capacitors MC1 to MCm through their source-drain paths, as shown. Those cells are also connected to a predetermined potential V. In the sense amplifier, P channel transistors Q14 and Q15 are connected in series between bit lines B and $\overline{B}$. The node of these transistors is coupled for reception with latch signal $\phi SA$. N channel transistors Q16 and Q17 of the sense amplifier are connected in series between bit lines B and $\overline{B}$. The node of these transistors is coupled for reception with latch signal $\overline{\phi SA}$. The gate of transistor Q14 is connected to bit line $\overline{B}$ and the gate of transistor Q16. The gate of transistor Q15 likewise is connected to bit line B and the gate of transistor Q17.

Column selection gate $11_1$ is made up of a transfer gate consisting of N channel MOS transistor Q18 inserted in bit line B, and another transfer gate consisting of N channel MOS transistor Q19 inserted in bit line $\overline{B}$. The gates of transistors Q18 and Q19 are coupled for reception with output signal C1 of column selection circuit $21_1$.

In a programming or write mode, the transistors Q11 and Q12 of the equalizing circuit are turned on by equalizing signal EQL. Under this condition, bit line pair B and $\overline{B}$ are precharged to a given potential by precharge signal VBL. A word line WL1, for example, is then selected to turn on the transistor $Q13_1$ coupled with the word line, and to charge capacitor MC1. In this way, the above sequence of operation is repeated to program column $51_1$.

In a read mode, word line WL1, for example, is selected, to turn on transfer transistor $Q13_1$. The capacitor cell MC1 is discharged to provide charges on bit lines B and $\overline{B}$. A potential difference is caused between paired bit lines, and is sensed and amplified by sense amplifier SA. The potential difference output from sense amplifier SA is output in the form of data to paired data lines D and $\overline{D}$, through transfer transistors Q18 and Q19 when these transistors are turned on.

Let us consider a case in which column $51_3$ is defective, that is, the data stored in the memory cell (not shown) connected to column $51_3$ is incorrect. In this case, the correct data to be originally stored or programmed in that memory cell is stored in redundant column 55. In a read mode of the memory system, this correct data is read out from redundant column 55 and used as the data from the defective column $51_3$, as in the above manner. The test method to check if the data in the memory cells are correct or not is well known, and is not essential to this invention. No further description will be given here.

Figure 5:
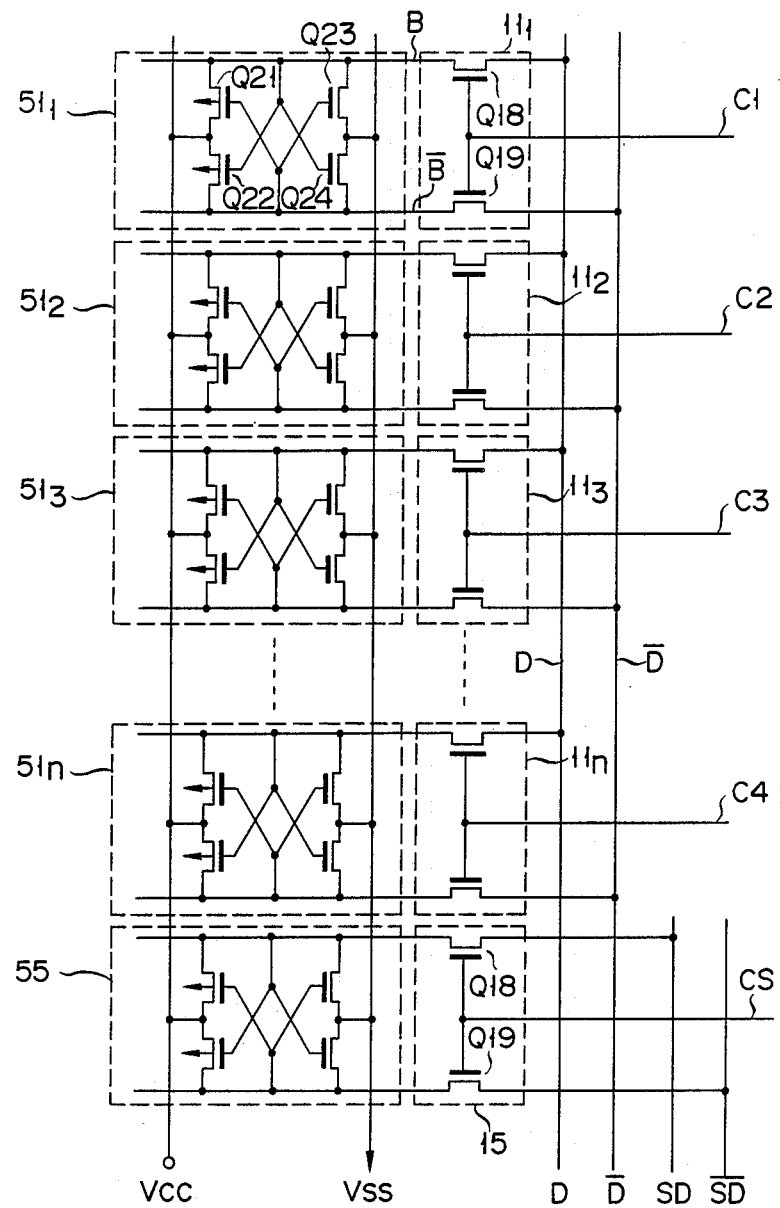
FIG. 5 shows another circuit diagram showing the columns and the column selection gates in the memory system of FIG. 2.

FIG. 5 shows another circuit arrangement of columns $51_1$ to $51n$, redundant column 55, and column selection gates $11_1$ to $11n$, and redundant column selection gate 15. These columns $51_1$ to $51m$, and 55 are constructed with data registers. Further, those columns and column selection gates have substantially the same circuit arrangements. The circuit arrangement of column selection gate $11_1$ is the same as that described with reference to FIG. 4. Hence, only column $51_1$ will typically be described.

Column $51_1$ is made up of P channel transistors Q21 and Q22 coupled in series between bit line pair B and $\overline{B}$, and N channel transistors Q23 and Q24 coupled in series between the bit line pair. The gate of transistor Q21 is connected to bit line $\overline{B}$ and the gate of transistor Q23. The gate of transistor Q22 is connected to bit line B and the gate of transistor Q24. The node of transistors Q21 and Q22 is connected to high potential source Vcc. Similarly, The node of transistors Q23 and Q24 is connected to low potential source Vss.

In the data register of column $51_1$, either of bit lines B and $\overline{B}$ is set at high potential Vcc according to a complementary signal applied to the bit lines. The same thing is true for other columns $51_2$ to $51n$. A known method tests columns $51_1$ to $51n$ if a defective column is contained in those columns. If the check shows column $51_3$ is defective, viz., bit line B which should be at high potential is at low potential, redundant column 55 is used in place of this defective column $51_3$. To this end, the correct data is loaded into redundant column 55 as a data register in a known manner. In the memory system thus programmed, when defective column $51_3$ is detected, the incorrect data derived from the defective column is blocked from going into the data input/output pin DQ and the correct data is read out in the manner as already described referring to FIG. 2.

FIG. 6 shows the details of column selection circuits $21_1$ to $21n$ as a shift register and start address set-up circuit 32.

The column selection circuits have substantially the same circuit arrangements, and therefore column selection circuit $21_1$ will typically be described.

Figure 7A:
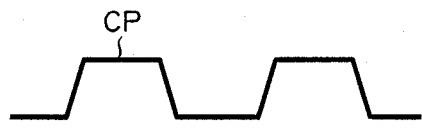
FIGS. 7A to 7C show a set of waveforms of control signals used in the FIG. 6 circuit.
Figure 7B:
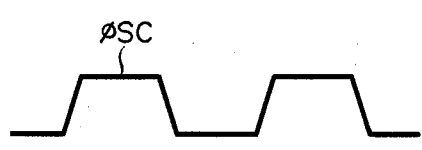
Figure 7C:
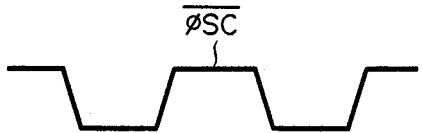

As shown, column selection circuit $21_1$ is made up of two pairs of inverters G1 and G2, and G3 and G4. The output terminal of inverter G1 is connected to the input terminal of inverter G2, while its input terminal is connected to the output terminal of inverter G2. The output terminal of inverter G3 is connected to the input terminal of inverter G4. The node of the input terminal of inverter G1 and the output terminal of inverter G2, is connected through transistor Q31 to the output terminal of the prestage column selection circuit 21n. The gate of transistor Q31 is applied with control signal $\overline{\phi SC}$, which is in synchronism and out of phase with clock pulse CP (FIG. 7A). The gate of transistor Q32 is applied with control signal $\phi SC$, which is in phase with control pulse signal CP. The node P14 of the output terminal of inverter G3 and the input terminal of inverter G4 constitutes an output terminal connecting to the MOS transistor Q31 of the next stage column selection circuit $21_2$.

Start address set-up circuit 32 is made up of setup circuits $33_1$ to $33n$ provided for column selection circuits $21_1$ to $21n$, respectively. The set-up circuit $33_1$ will typically be described because those set-up circuit's arrangements are substantially the same. Set-up circuit $33_1$ is comprised of AND gate J and transfer gate of transistor Q33. The transfer gate Q33 transfers the output data signal of AND gate J to the node P11 of inverters G1 and G2 in the column selection circuit $21_1$. This AND gate receives i-bit address data SA0 to SAi-1 and $\overline{SA0}$ to $\overline{SAi-1}$. Transfer gate transistor Q33 receives at the gate control pulse signal $\phi SET$, which is for setting up the column selection circuits $21_1$ to $21n$ by the start address data. The start address set-up cycle is provided in addition to the serial access cycle for columns $51_1$ to $51n$.

AND gates J of set-up circuits $33_1$ to $33n$ have different connections to the start address lines.

In operation, it is assumed that start address SA0 to SAi-1 are all in "L" (low) level. At this time, the complementry address $\overline{SA0}$ to $\overline{SAi-1}$ are all in "H" (high) level, and AND gate J of set-up circuit $33_1$ is enabled to produce an "H" level signal. In this state, when control signal $\phi SET$ is at to the "H" level, transfer gate Q33 of set-up circuit $33_1$ is enabled to transfer the "H" level signal to column selection circuit $21_1$, more exactly node P11 of this circuit. The "H" level signal transferred to node P11 is inverted by inverter G1 and appears as an "L" level signal at node P12. In this state, when transfer gate Q32 is enabled by control signal $\phi SC$, the "L" level signal transfers to node P13 via transfer gate Q32. The "L" signal at node P13 is inverted by inverter G3 and appears as a "H" level signal at node P14. The "H" level signal is output as the output signal C1 of column selection circuit $21_1$ to column selection gate $11_1$ and to column selection circuit $21_2$. Under this condition, control signal $\overline{\phi SC}$ is applied to transfer gate Q31 in column selection circuit $21_2$ and enables it. Then, the "H" level output signal reaches node P11 in the column selection circuit $21_2$. As a result, column selection circuit $21_2$ is set up. In this way, the remaining column selection circuits $21_3$ to $21n$ are successively set up with output signals C2 to Cn. The memory system is ready for the serial access cycle to the columns $51_1$ to $51n$.

Figure 8:
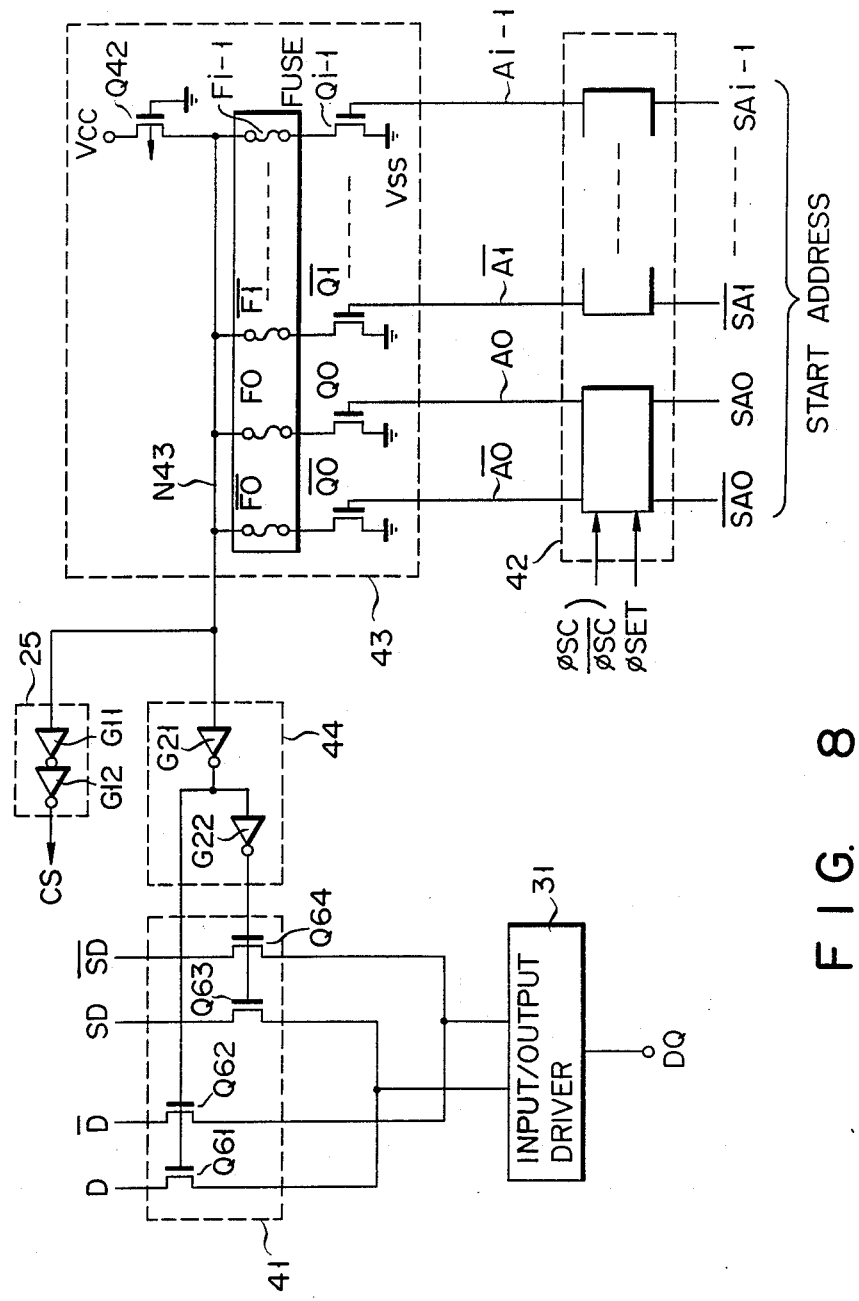
FIG. 8 shows a circuit diagram of a defective address detecting system used in the FIG. 2 memory system.

FIG. 8 shows an overall circuit operating when a defective column is detected. The overall circuit comprises data line switching circuit 41, address counter 42, defective address detection circuit 43 and redundant data-line selection circuit 44, and redundant column selection circuit 25.

Address counter 42 may be a normal synchronous counter of the preset type.

Defective address detection circuit 43 is made up of N channel MOS transistors Q0 to Qi-1 and $\overline{Q0}$ to $\overline{Qi-1}$, fuse F0 to Fi-1 and $\overline{F0}$ to $\overline{Fi-1}$, and P channel MOS transistor Q42. Those N channel MOS transistors receive at the gates the output data consisting of bits A0 to Ai-1 and $\overline{A0}$ to $\overline{Ai-1}$ derived from address counter 42. Those fuses are connected at the first ends to the first ends of the source-drain paths of MOS transistors Q0 to Qi-1 and $\overline{Q0}$ to $\overline{Qi-1}$, while at second ends to the one end of the source-drain path of MOS transistor Q42. The other end of the source-drain path of transistor Q42 is coupled with high potential power source Vcc, and its gate is grounded. The second ends of the source-drain paths of transistors Q0 to Qi-1 and $\overline{Q0}$ to $\overline{Qi-1}$ are grounded.

Figure 9:
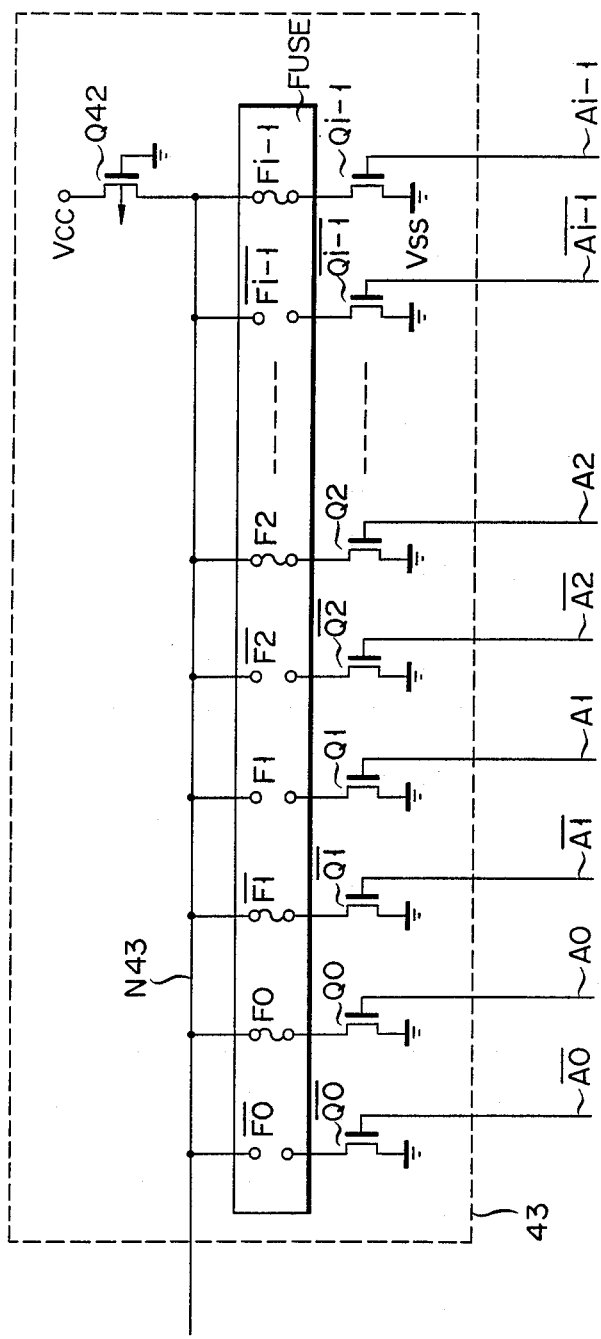
FIG. 9 shows a circuit diagram of the defective address detection circuit used in the defective address detecting system.

Those fuses are for programming the address of a defective column. In the illustration of FIG. 8, all the fuses are not blown off. Actually, if a defective column is contained, the fuse associated with the defective address is selectively blown off, as shown in FIG. 9, for example. At this time, node N43 for the fuses is at high potential Vcc.

Redundant column selection circuit 25 is made up of a couple of inverters G11 and G12. The input of the prestage inverter G11 is coupled with node N43 as the output of redundant address detection circuit 43. The succeeding stage inverter G12 produces signal CS as its output signal.

Redundant data-line selection circuit 44 is made up of a couple of inverters G21 and G22 connected in a cascade fashion. The input of the prestage inverter G21 is coupled with the node N43.

Data line switching circuit 41 is made up of N channel MOS transistors Q61 to Q64. The source-drain paths of transistors Q61 and Q62 are connected at the first ends to data lines D and $\overline{D}$. The source-drain paths of transistors Q63 and Q64 are connected at the first ends to redundant data lines SD and $\overline{SD}$. The second ends of the source-drain paths of transistors Q61 and Q63 are connected together to one of the input terminals of input/output driver 31. The second ends of the source-drain paths of transistors Q62 and Q64 are connected together to the other input terminal of input/output driver 31. The gates of transistors Q63 and Q64 are coupled with the output terminal of inverter G22.

The input/output driver 31 may be any of known input/output drivers.

In response to control signal $\phi SET$, start address SA0 to SAi-1 and $\overline{SA0}$ to $\overline{SAi-1}$ are set in address counter 42 as an initial value. Thereafter, every time the address counter 42 receives signals $\phi SC$ and $\overline{\phi SC}$, which are in synchronism with clock signal CP, the contents of address counter 42 increase by logically "1" from the initial value. The contents of address counter 42 are input to the gates of transistors Q0 to Qi-1 and $\overline{Q0}$ to $\overline{Qi-1}$. ( It is assumed that column $51_3$ is defective and the fuses F0 to Fi-1 and $\overline{F0}$ to $\overline{Fi-1}$ of defective address detection circuit 43 are selectively blown out so that the address Ai-1 ..., A2, A1 A0 of column $51_3$ is programmed in defective address detection circuit 43. When the address Ai-1, ..., A2, A1, A0 of column $51_3$ is 0, ..., 0, 1, 0, the fuses F0 to Fi-1 and $\overline{F0}$ to $\overline{Fi-1}$ are selectively blown out as shown in FIG. 9. When the address Ai-1, ..., A2, A1, A0 output from address counter 42 is 0, ..., 0, 1, 0, transistors Q0, $\overline{Q1}$, Q2, ..., Qi-1 having fuses F0, $\overline{F1}$, F2, ..., Fi-1, respectively, are all off. Therefore, the output node N43 is separated from ground potential and at high potential Vcc. The high potential Vcc is applied to the node between the gates of transistors Q18 and Q19 in redundant column select gate 15 (FIG. 4 or 5), through redundant column select circuit 25. The result is to connect redundant column 55 to redundant data lines SD and $\overline{SD}$. The data is read out from redundant column 55 to redundant data lines SD and $\overline{SD}$. The high potential Vcc signal from output node N43 becomes a low potential signal through the inverter G21 of redundant data-line selection circuit 44, and input to the gates of transistors Q61 and Q62 in data-line selection circuit 41. Then, transistors Q61 and 62 are turned off, and disconnected from drive circuit 31. The high potential signal from node N43 is also input to the gates of transistors Q63 and Q64, through inverters G21 and G22. Therefore, those transistors Q63 and Q64 are turned on, to set up the connection of redundant data lines SD and $\overline{SD}$ and driver 31. In this way, regular data lines D and $\overline{D}$ are disconnected from input/output driver 31, while redundant data lines SD and $\overline{SD}$ are connected to input/output driver 31. Finally, the correct data is output through input/output pin DQ. During the operation of the circuit system for the defective address, column selection circuit $21_3$ associated with the defective column $51_3$ is normally operated to drive the next stage column selection circuit $21_4$. Therefore, the serial access operation to columns $51_1$ to $51n$ may smoothly progress.

As seen from the foregoing description, this invention allows the redundant column to be used for the memory system of the serial column access type.

What is claimed is:

1. A semiconductor memory system of the serial column access type comprising:
   "n" regular columns, where "n" is a positive integer;
   "n" column selection gates provided respectively corresponding to said regular columns;
   regular data lines connected through said column selection gates respectively to said columns;
   "n" column selection circuits respectively provided for said column selection gates, in which said column selection circuits comprise a shift register;
   a redundant column used for replacing a defective column;
   a redundant column selection gate provided for said redundant column;
   redundant data lines connected to said redundant column through said redundant column selection gate;
   a data input/output driver;
   defective address detection means for detecting the address of a defective column to select said redundant column; and
   data line switching means for switching, in redundant column select mode, the data lines connected to the data input/output driver from said regular data lines to said redundant data lines.

2. A semiconductor memory system according to claim 1, and further comprising a start address set-up means for setting up said column selection circuits in response to a start address and a control signal, wherein the start address set-up means enables the column selection circuit corresponding to the start address.

3. A semiconductor memory system of the serial column access type comprising:
   "n" regular columns, where "n" is a positive integer;
   "n" column selection gates provided respectively corresponding to said regular columns;
   regular data lines connected through said column selection gates respectively to said columns;
   "n" column selection circuits respectively provided for said column selection gates;
   a redundant column used for replacing a defective column;
   a redundant column selection gate provided for said redundant column;
   redundant data lines connected to said redundant column through said redundant column selection gate;
   a data input/output driver;
   defective address detection means for detecting the address of a defective column to select said redundant column, in which said defective address detection means includes an address counter for monitoring the address, a defective address detection circuit for detecting a defective address from an address signal output by the address counter, and a redundant column selection circuit for selecting a redundant column by driving said redundant column selection gate in response to a defective address detection signal output from said defective address detection circuit, thereby to connect said redundant column to said redundant data lines; and
   data line switching means for switching, in redundant column select mode, the data lines connected to the data input/output driver from said regular data lines to said redundant data lines.

4. A semiconductor memory system according to claim 3, further comprising start address set-up means for setting up said column selection circuits and said address counter.

5. A semiconductor memory system according to claim 3, in which said data line switching means includes a redundant data-line selection circuit for producing a redundant data-line selection signal in response to the defective address detection signal output from said defective address detection circuit, and a data-line switching circuit for disconnecting, in response to the redundant data-line selection signal of said redundant data-line selection circuit, said regular data lines from said input/output driver, and for connecting said redundant data lines to said input/output driver.

6. A semiconductor memory system according to claim 5, in which said column selection circuits comprise a shift register.

7. A semiconductor memory system according to claim 6, and further comprising start address set-up means for setting up said column selection circuits and said address counter in response to a start address and a control signal, wherein the start address set-up means sets the start address in said address counter as an initial value, and wherein the start address set-up means enables the column selection circuit corresponding to the start address.

8. A semiconductor memory system according to claim 5, and further comprising start address set-up means for setting up said column selection circuits and said address counter in response to a start address and a control signal, wherein the start address set-up means sets the start address in said address counter as an initial value, and wherein the start address set-up means enables the column selection circuit corresponding to the start address.

9. A semiconductor memory system according to claim 3, in which said column selection circuits comprise a shift register.

10. A semiconductor memory system according to claim 9, and further comprising start address set-up means for setting up said column selection circuits and said address counter in response to a start address and a control signal, wherein the start address set-up means sets the start address in said address counter as an initial value, and wherein the start address set-up means enables the column selection circuit corresponding to the start address.

11. A semiconductor memory system according to claim 3, and further comprising start address set-up means for setting up said column selection circuits and said address counter in response to a start address and a control signal, wherein the start address set-up means sets the start address in said address counter as an initial value, and wherein the start address set-up means enables the column selection circuit corresponding to the start address.

12. A semiconductor memory system of the serial column access type comprising:
"n" regular columns, where "n" is a positive integer;
"n" column selection gates provided respectively corresponding to said regular columns;
regular data lines connected through said column selection gates respectively to said columns;
"n" column selection circuits respectively provided for said column selection gates;
a redundant column used for replacing a defective column;
a redundant column selection gate provided for said redundant column;
redundant data lines connected to said redundant column through said redundant column selection gate;
a data input/output driver;
defective address detection means for detecting the address of a defective column to select said redundant column; and
data line switching means for switching, in redundant column select mode, the data lines connected to the data input/output driver from said regular data lines to said redundant data lines, in which said data line switching means includes a redundant data-line selection circuit for producing a redundant data-line selection signal in response to a defective address detection signal output from said defective address detection means, and a data-line switching circuit for disconnecting, in response to the redundant data-line selection signal of said redundant data-line selection circuit,
said regular data lines from said input/output driver, and for connecting said redundant data lines to said input/output driver.

13. A semiconductor memory system according to claim 12, in which said column selection circuits comprise a shift register.

14. A semiconductor memory system according to claim 13, and further comprising start address set-up means for setting up said column selection circuits in response to a start address and a control signal, wherein the start address set-up means enables the column selection circuit corresponding to the start address.

15. A semiconductor memory system according to claim 12, and further comprising start address set-up means for setting up said column selection circuits in response to a start address and a control signal, wherein the start address set-up means enables the column selection circuit corresponding to the start address.

16. A semiconductor memory system of the serial column access type comprising:
"n" regular columns, where "n" is a positive integer;
"n" column selection gates respectively provided corresponding to said regular columns;
regular data lines connected through said column selection gates respectively to said columns;
"n" column selection circuits comprising a shift register, respectively provided for said column selection gates;
a redundant column used for replacing a defective column;
redundant data lines connected to said redundant column through a redundant column selection gate;
a defective address detection circuit for detecting the address of a defective column to enable said redundant column selection gate;
an address counter for said defective address detection circuit for monitoring the address and for outputting an address signal to said defective address detection circuit;
start address set-up means for setting up said column selection circuits and said address counter in response to a start address and a control signal, wherein the start address set-up means sets the start address in said address counter as an initial value, and wherein the start address set-up means enables the column selection circuit corresponding to the start address;
a redundant column selection circuit for selecting said redundant column in response to a defective address detection signal from said defective address detection circuit;
a data input/output drive circuit; and
data line switching means for switching, in redundant column select mode, the data lines connected to said data input/output drive circuit from said regular data lines to said redundant data lines.

17. A semiconductor memory system according to claim 16, in which said data line switching means includes a redundant data-line selection circuit for producing a redundant data-line selection signal in response to the defective address detection signal output from said defective address detection circuit, and a data-line switching circuit for disconnecting, in response to the redundant data-line selection signal of said redundant data-line selection circuit, said regular data lines from the data input/output drive circuit, and for connecting said redundant data lines to said data input/output drive circuit.

* * * * *